(12) United States Patent
Kitabayashi et al.

(10) Patent No.: US 10,770,367 B2
(45) Date of Patent: Sep. 8, 2020

(54) SEMICONDUCTOR APPARATUS, METHOD FOR MANUFACTURING THE SAME AND ELECTRIC POWER CONVERSION DEVICE

(71) Applicant: Mitsubishi Electric Corporation, Tokyo (JP)

(72) Inventors: Takuya Kitabayashi, Tokyo (JP); Hiroshi Yoshida, Tokyo (JP); Hidetoshi Ishibashi, Tokyo (JP); Daisuke Murata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/159,745

(22) Filed: Oct. 15, 2018

(65) Prior Publication Data
US 2019/0304866 A1 Oct. 3, 2019

(30) Foreign Application Priority Data
Mar. 30, 2018 (JP) .................................. 2018-067818

(51) Int. Cl.
| | | |
|---|---|---|
| H01L 23/02 | (2006.01) | |
| H01L 23/31 | (2006.01) | |
| H01L 23/12 | (2006.01) | |
| H01L 23/58 | (2006.01) | |
| H01L 23/492 | (2006.01) | |

(52) U.S. Cl.
CPC .......... *H01L 23/3142* (2013.01); *H01L 23/02* (2013.01); *H01L 23/12* (2013.01); *H01L 23/492* (2013.01); *H01L 23/585* (2013.01)

(58) Field of Classification Search
CPC . H01L 2224/73265; H01L 2224/32225; H01L 2924/15787; H01L 2224/4225; H01L 23/02; H01L 23/10; H01L 23/12; H01L 23/3142; H01L 23/3735
USPC .......................... 257/678, 693, 701, 704, 710
See application file for complete search history.

(56) References Cited

U.S. PATENT DOCUMENTS

| | | | | |
|---|---|---|---|---|
| 5,646,445 A | * | 7/1997 | Masumoto | .............. H01L 23/24 257/703 |
| 5,747,875 A | * | 5/1998 | Oshima | .................... H01L 25/16 257/687 |
| 5,796,038 A | * | 8/1998 | Manteghi | ............ H01L 21/4857 174/526 |

(Continued)

FOREIGN PATENT DOCUMENTS

JP      2000-040759 A      2/2000

OTHER PUBLICATIONS

An Office Action mailed by the German Patent and Trademark Office dated Dec. 13, 2019, which corresponds to German Patent Application No. 102019202038.0 and is related to U.S. Appl. No. 16/159,745.

*Primary Examiner* — S. V. Clark
(74) *Attorney, Agent, or Firm* — Studebaker & Brackett PC

(57) ABSTRACT

A semiconductor apparatus includes: a substrate including a circuit pattern on an upper surface side and a metal plate on a lower surface side; a semiconductor device joined to the circuit pattern via a conductive component; a case located to surround the substrate; a sealing material sealing the semiconductor device and the substrate in a section surrounded by the case; and a bonding agent bonding the case and the metal plate on a side face of the substrate.

13 Claims, 6 Drawing Sheets

(56) References Cited

U.S. PATENT DOCUMENTS

| | | | |
|---|---|---|---|
| 6,184,580 B1 * | 2/2001 | Lin | H01L 23/3128 |
| | | | 257/706 |
| 6,316,826 B1 * | 11/2001 | Yamamoto | H01L 23/3732 |
| | | | 257/705 |
| 6,787,900 B2 * | 9/2004 | Shinohara | H01L 23/13 |
| | | | 257/675 |
| 7,633,151 B2 * | 12/2009 | Too | H01L 23/04 |
| | | | 257/704 |
| 10,468,372 B2 * | 11/2019 | Eguchi | H01L 23/02 |
| 2005/0035446 A1 * | 2/2005 | Karpman | B81B 7/0048 |
| | | | 257/711 |
| 2009/0244868 A1 * | 10/2009 | Morita | H01L 23/047 |
| | | | 361/783 |

\* cited by examiner

SEMICONDUCTOR APPARATUS, METHOD FOR MANUFACTURING THE SAME AND ELECTRIC POWER CONVERSION DEVICE

BACKGROUND OF THE INVENTION

Field

The present invention relates to a semiconductor apparatus, a method for manufacturing the same and an electric power conversion device.

Background

Enhanced performance of power modules in recent years has led to a tendency of their increasingly higher operating temperature. For power modules capable of operating at high temperature, electrical insulation must be ensured by preventing separation of sealing resin from other parts and cracks in insulating substrates. In Japanese Patent Application Publication No. 2000-40759, for ensuring electrical insulation of the power module, its substrate and case are joined together with a bonding agent and sealed.

SUMMARY

In the power module of Japanese Patent Application Publication No. 2000-40759, the lower surface of a circuit substrate carrying a semiconductor device thereon is connected with a base plate, and the base plate and the case are joined together with a bonding agent, which is semi-solid so as to avoid uneven application thereof. One problem is that, since the case is connected to the upper surface of the base plate with a bonding agent, the effective area of the circuit substrate on the base plate is reduced.

The present invention was made to solve the problem described above and it is an object of the invention to ensure electrical insulation while avoiding a reduction in effective area of a circuit pattern, by connecting a base plate and a case with a bonding agent on a side face of the base plate.

A semiconductor apparatus according to the present invention includes: a substrate including a circuit pattern on an upper surface side and a metal plate on a lower surface side; a semiconductor device joined to the circuit pattern via a conductive component; a case located to surround the substrate; a sealing material sealing the semiconductor device and the substrate in a section surrounded by the case; and a bonding agent bonding the case and the metal plate on a side face of the substrate.

The present invention makes it possible to ensure electrical insulation while avoiding a reduction in effective area of a circuit pattern, by connecting a base plate and a case with a bonding agent on a side face of the base plate.

Other and further objects, features and advantages of the invention will appear more fully from the following description.

DESCRIPTION OF EMBODIMENTS

First Embodiment

Figure 1:
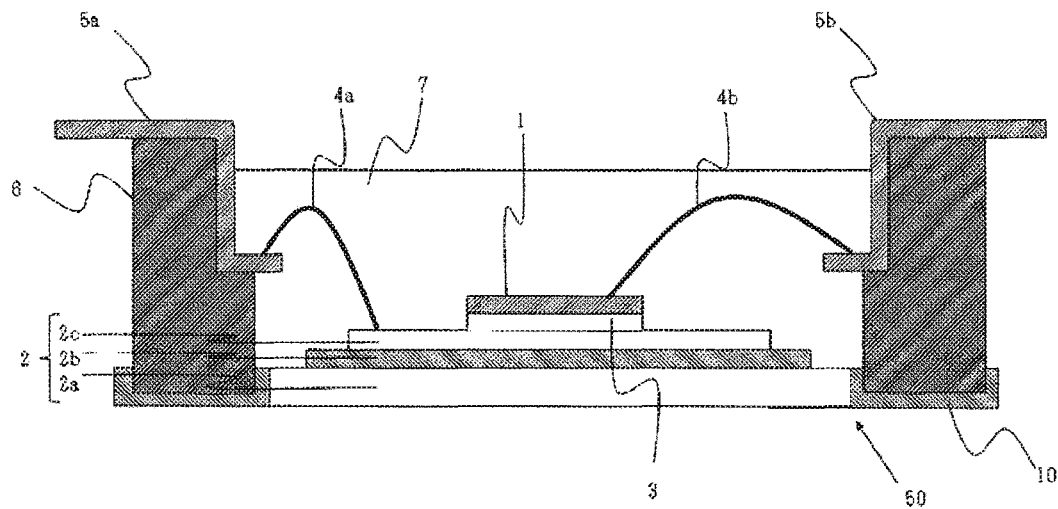
FIG. 1 is a cross-sectional view illustrating the power module according to the first embodiment.

A power module 50 according to a first embodiment will be described. FIG. 1 is a cross-sectional view illustrating the power module 50 according to the first embodiment. Same reference numerals in other drawings represent the same or equivalent parts as shown in FIG. 1. A semiconductor device 1 in the power module 50 shown in FIG. 1 is joined to an upper surface of a substrate 2 via a conductive component 3.

The substrate 2 is made up of a base plate 2a, an insulating layer 2b, and a circuit pattern 2c. The insulating layer 2b is provided on the base plate 2a. The circuit pattern 2c is provided on the insulating layer 2b. The base plate 2a and the circuit pattern 2c are made of copper, for example. The insulating layer 2b provides electrical insulation from the outside of the power module 50 and may be made of an inorganic ceramic material, for example, or a thermosetting resin such as epoxy resin containing ceramic powder dispersed therein.

One end of a terminal 5a is electrically connected to the circuit pattern 2c via a conductive wire 4a, while the other end is used for transmission and reception of electrical signals to and from the outside. One end of a terminal 5b is electrically connected to a surface electrode of the semiconductor device 1 via a conductive wire 4b, while the other end is used for transmission and reception of electrical signals to and from the outside. The terminals 5 (Sa, 5b) can be made of any materials as long as they are conductive.

The semiconductor device 1, substrate 2, and conductive wires 4 (4a, 4b) are surrounded by a case 6. The case 6 is made of a plastic resin or the like and formed by outsert molding such that the terminals 5 are outside. Alternatively, the case 6 may be formed by insert molding to have the terminals 5 inside, or joined to the circuit pattern 2c via a conductive component.

The semiconductor device 1, the substrate 2, and the conductive wires 4 are covered by a sealing material 7. The sealing material 7 can be made of any material as long as it is of insulating nature, such as, for example, epoxy resin, gel, and the like. The terminals 5 are partly exposed from the surface of the sealing material 7 for transmission and reception of signals to and from the outside. The backside of the substrate 2 is exposed from the sealing material 7 and cooled by a heat sink or the like. The backside of the substrate 2 need not necessarily be exposed from the sealing material 7 as long as it can be properly cooled.

The substrate 2 and the case 6 are secured on a side face of the substrate 2 by a bonding agent 10. Namely, the base plate 2a and the case 6 are bonded together on a side face of the base plate 2a, so that a reduction of effective area of the circuit pattern 2c can be minimized. While FIG. 1 shows the lower surface of the base plate 2a and the lower surface of the bonding agent 10 being on the same plane, the lower surface of the base plate 2a can be coplanar with the lower surface of the case 6.

The bonding agent 10 can be made of any thermoplastic resins, including, for example, polyvinylidene fluoride, polyether ether ketone resin, polyether block amide copolymer, tetrafluoroethylene hexafluoropropylene copolymer, perfluoroalkoxy fluoro resin, unplasticized shrinkable polyvinyl chloride, polyethylene, polypropylene, olefin-based elastomer, silicone, and polychloroprene rubber.

When heat is applied, the bonding agent 10 can change its shape such as to be fitted completely between the bottoms of the base plate 2a and the case 6 so that the base plate 2a and the case 6 can be firmly secured to each other without the worry of uneven bonding. In a high-humidity environment where water condensation can easily occur, in particular, when a gap is created between the base plate 2a and the case 6 due to uneven bonding or the like, water can enter the power module 50 through the gap between the base plate 2a and the case 6. The penetrating water may cause a hydrolytic reaction when absorbed by the insulating layer 2b and deteriorate the insulating layer 2b. Therefore, it is crucial to connect the base plate 2a and the case 6 by the bonding agent 10 without any gaps. The present invention can thus prevent deterioration of insulating properties of the power module 50.

Figure 2:
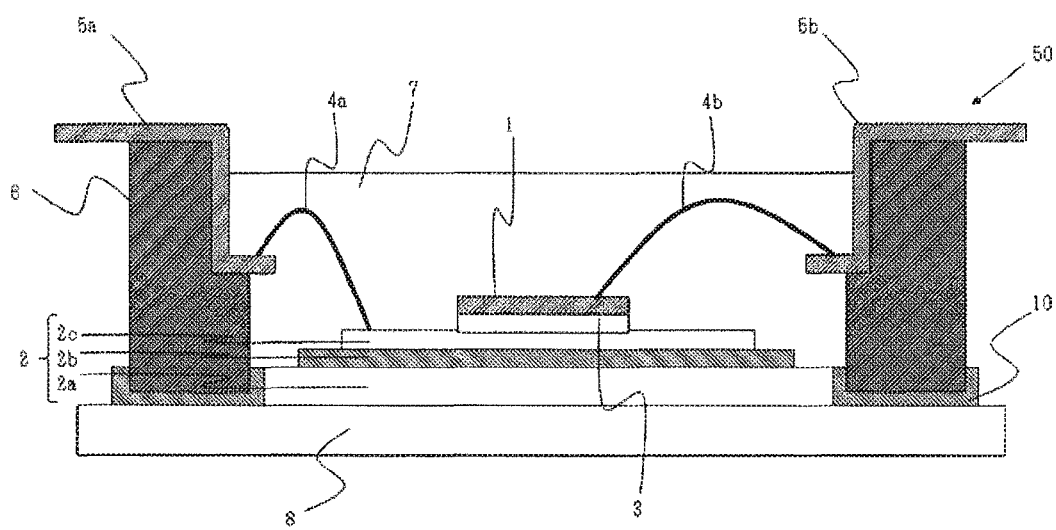
FIG. 2 is a cross-sectional view illustrating the power module according to the first embodiment during the operation.

During the operation of the power module 50, the heat sink 8 for cooling the heat during operation connects to the base plate 2a via a thermal interface material (TIM) such as grease as shown in FIG. 2. Since the bonding agent 10 is attached to the lower part of the case 6 such as to cover the lower inner part, the lower outer part, and the lower surface of the case 6, ingress of water from a side of the case 6 can be prevented. Thus penetration of water into the power module 50 through the gap between the case 6 and the heat sink 8 can be prevented.

Referring to FIG. 1, the circuit configuration with one each IGBT and diode (not shown) connected in parallel will be described, wherein the semiconductor device 1 is the IGBT, and the diode is provided on the circuit patter 2c spaced therefrom in a direction perpendicular to the paper plane. The terminal 5a is P terminal of the power module 50 and electrically connected to a collector electrode that is the backside electrode of the semiconductor device 1 via the conductive wire 4a. The emitter electrode that is the surface electrode of the semiconductor device 1 is electrically connected to the terminal 5b that is N terminal of the power module 50 via the conductive wire 4b. The collector electrode of the semiconductor device 1 is electrically connected to the cathode electrode of the diode, while the emitter electrode of the semiconductor device 1 is electrically connected to the anode electrode of the diode, to form a parallel circuit of a 1-in-1 module. A circuit having a configuration different from the one described above can be formed, such as, for example, a half bridge circuit of a 2-in-1 module, or a three phase inverter circuit of a 6-in-1 module. The external circuit 5b can serve as an output terminal depending on the circuit configuration.

Figure 3:
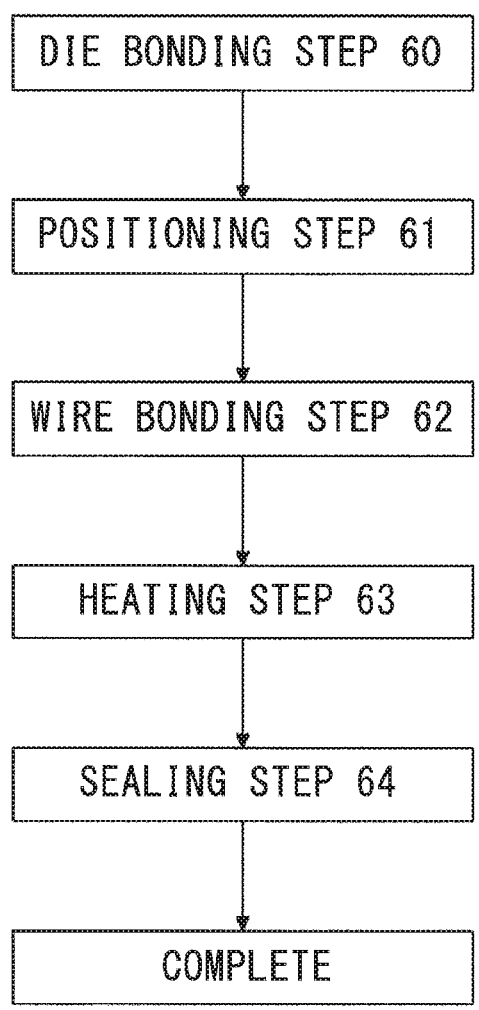
FIG. 3 is a flowchart showing the method of manufacturing the semiconductor apparatus according to the first embodiment.

Next, the method of producing the semiconductor device according to the first embodiment will be described with reference to FIG. 3. FIG. 3 is a flowchart showing the method of producing the semiconductor device having the base plate 2a and the case 6 fixed with the bonding agent 10. The method of producing the semiconductor device according to the first embodiment includes a die bonding step 60 wherein the semiconductor device 1 and the substrate 2 are joined, a positioning step 61 wherein the base plate 2a and the case 6 are positioned, a wire bonding step 62 wherein wires are provided for forming an electronic circuit, a heating step 63 of heating the bonding agent 10 to secure the base plate 2a and the case 6, and a sealing step 64 of sealing the package with the sealing material 7.

Figure 4:
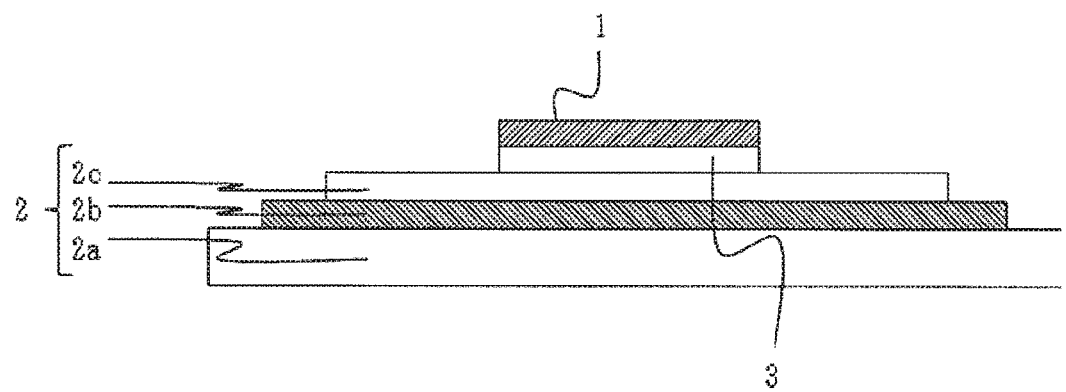
FIG. 4 is a cross-sectional view illustrating a connection between the semiconductor device and the substrate.

Each step in FIG. 3 will be described. First, the die bonding step 60 will be described with reference to FIG. 4. The semiconductor device 1 is joined to the substrate 2 with the conductive component 3. The substrate 2 used here may have the base plate 2a, the insulating layer 2b, and the circuit pattern 2c connected to each other beforehand, or, these may be connected to each other by the die bonding step 60. The terminals 5 used for transmission and reception of electrical signals to and from the outside may be joined to the circuit pattern 2c via a conductive component, or, the terminals 5 may be integrally formed with the case 6 by insert molding. In the present invention, the terminals 5 integrally formed with the case 6 as shown in FIG. 1 shall be described as being used for transmission and reception of electrical signals to and from the outside.

Figure 5:
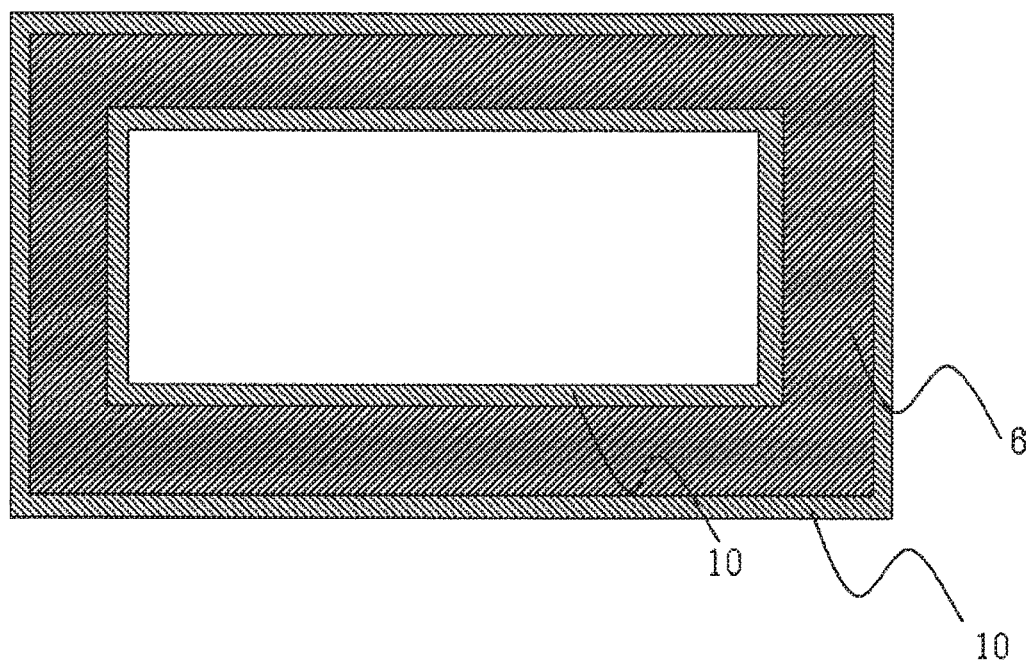
FIG. 5 is a top plan view of the case with the bonding agent attached thereto.
Figure 6:
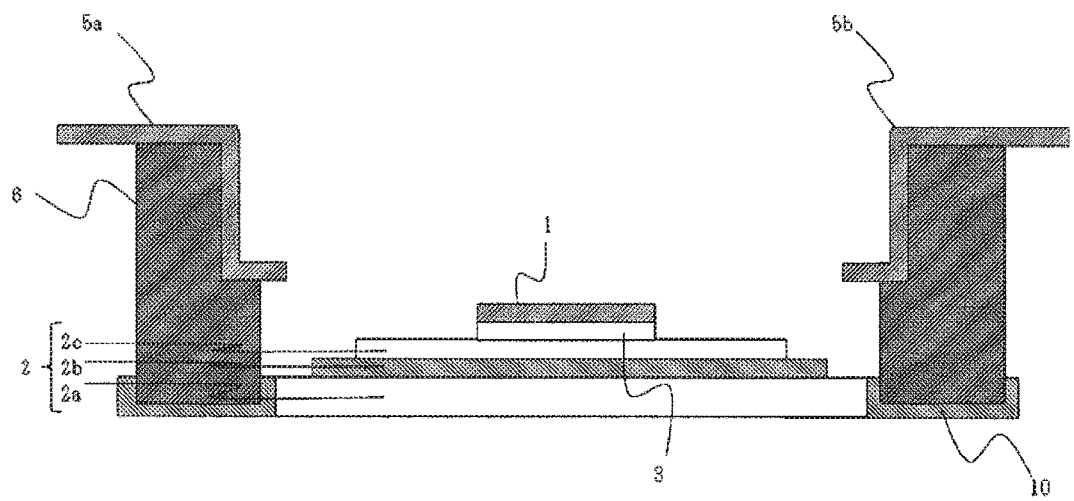
FIG. 6 is a cross-sectional view of the base plate and the case connected to each other via the bonding agent.

Next, the positioning step 61 will be described with reference to FIG. 5 and FIG. 6. FIG. 5 is a top plan view of the case 6 with the bonding agent 10 attached thereto, and FIG. 6 is a cross-sectional view of the base plate 2a and the case 6 connected to each other via the bonding agent 10. For convenience of explanation, FIG. 5 does not show the terminals 5. In the positioning step 61, the base plate 2a and the case 6 are set in predetermined positions, and temporarily fixed. The bonding agent 10 is attached to the case 6 such as to cover the lower inner part, the lower outer part, and the lower surface of the case 6 as shown in FIG. 5 and FIG. 6. Since the lower part of the case 6 is covered by the bonding agent 10, the adhesion between the case 6 and the bonding agent 10 can be enhanced. Therefore, the base plate 2a and the case 6 can be temporarily fixed without using positioning jigs, by fitting the base plate 2a with the lower inner part of the case 6.

This way, the base plate 2a and the case 6 can be positioned easily without the need to use a positioning jig. The base plate 2a and the case 6 can be temporarily fixed, for example, by a ring-like bonding agent 10 integrally or separately attached to the case 6.

Figure 7:
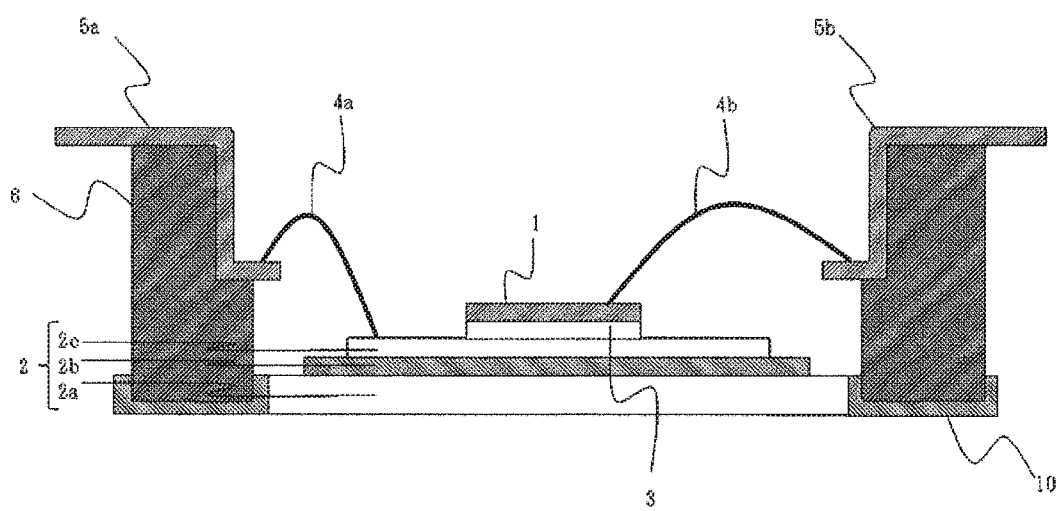
FIG. 7 is a cross-sectional view illustrating an electrical connection by the wire bonding.

The wire bonding step 62 follows the positioning step 61. The wire bonding step 62 will be described with reference to FIG. 7. In the wire bonding step 62, the terminals 5 used for transmission and reception of electrical signals to and from the outside are electrically connected to the semiconductor device 1 via the conductive wires 4 to form various electronic circuits such as an inverter circuit. Since the base plate 2a and the case 6 are temporarily fixed with the bonding agent 10 at this time, the base plate 2a and the case 6 can be prevented from displacing from each other even when pressure is applied to the substrate 2 during the wire bonding. When the bonding agent 10 that covers the base plate 2a and the lower part of the case 6 is placed on a flat surface, in particular, vibration during the wire bonding is absorbed by the bonding agent 10 that covers the lower surface of the case 6, so that displacement of the base plate 2a and the case 6 relative to each other can be prevented.

Next, the heating step 63 will be described. In the heating stop 63, the bonding agent 10 is heated in a high-temperature atmosphere with a heating furnace or the like having a heat source to change shape as required, so that the base plate 2a and the case 6 are fixed without gaps therebetween. The bonding agent 10 is a material that undergoes thermal shrinkage at a temperature of 100° C. to 150° C. Any heating method can be employed, whether contacted with the heat source or not, as long as the temperature of the bonding agent 10 is raised to 100° C. or more. The outer part of the case 6 should preferably be covered by the bonding agent 10 so that thermally shrinking bonding agent 10 applies pressure from the outer part of the case 6 to the base plate 2a, whereby the base plate 2a and the case 6 can be firmly secured.

Lastly, the sealing step 64 will be described. In the sealing step 64, the sealing material 7 is injected to a section surrounded by the case 6 to encapsulate the section and provide electrical insulation between the outside and the semiconductor device 1. In injecting the sealing material 7, the heat of the heat source used in the heating step 63 may be utilized to improve the flowability of the sealing material 7.

The sealing material 7 is a resin in liquid form and hardens when the temperature reaches and/or exceeds a preset level. The sealing material 7 needs to be heated after being injected. When the sealing material 7 is hardened by heat application, the sealing step 64 is finished, and the power module 50 shown in FIG. 1 is manufactured. Any heating method can be employed, whether contacted with the heat source or not, as long as the temperature of the sealing material 7 is raised to a level at which the sealing material hardens. A lid may further be provided above the sealing material 7 to protect the sealing material 7 from external disturbances such as water. The lid can prevent moisture absorption by the sealing material 7 and thereby the reliability of the power module can be improved.

According to the power module according to the first embodiment, the base plate 2a and the case 6 are connected by the bonding agent 10 on the side face of the base plate 2a. This way, electrical insulation can be ensured while securing an effective area of the circuit pattern 2c.

Since the base plate 2a and the case 6 are connected by the bonding agent 10 on the side face of the base plate 2a, the base plate 2a and the case 6 are joined without any gaps therebetween, which provides the effect of minimizing deterioration of the insulating layer 2b caused by moisture absorption.

Second Embodiment

Figure 8:
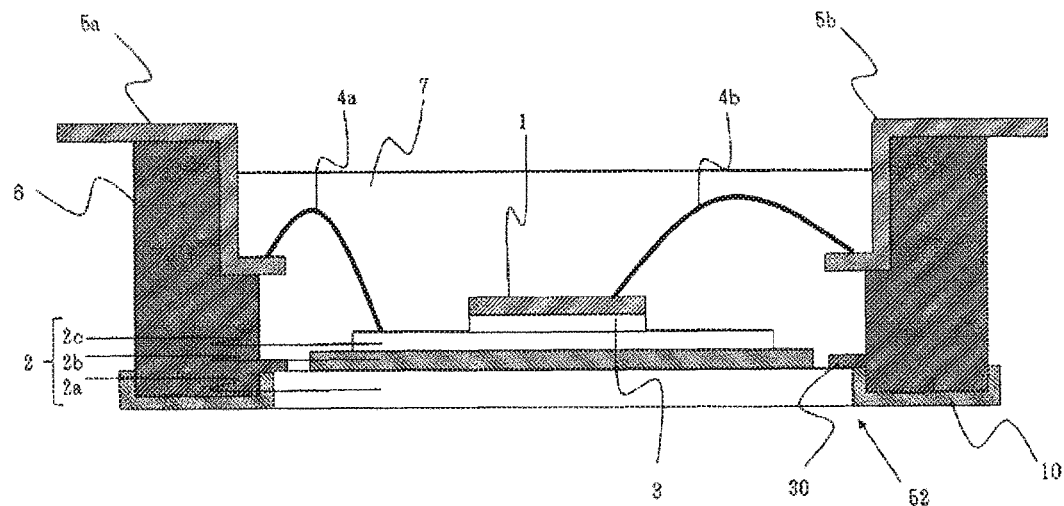
FIG. 8 is a cross-sectional view illustrating a power module according to the second embodiment.

A power module according to a second embodiment will be described. FIG. 8 is a cross-sectional view illustrating the power module 52 according to the second embodiment. In the power module 52 according to the second embodiment, protrusions 30 that make contact with the upper surface of the base plate 2a are provided to the case 6.

According to the power module according to the second embodiment, the protrusions 30 function as a guide for positioning the base plate 2a and the case 6 in the positioning step 61, so that the base plate 2a and the case 6 can be easily positioned and temporarily fixed without requiring any positioning jigs or the like.

Figure 9:
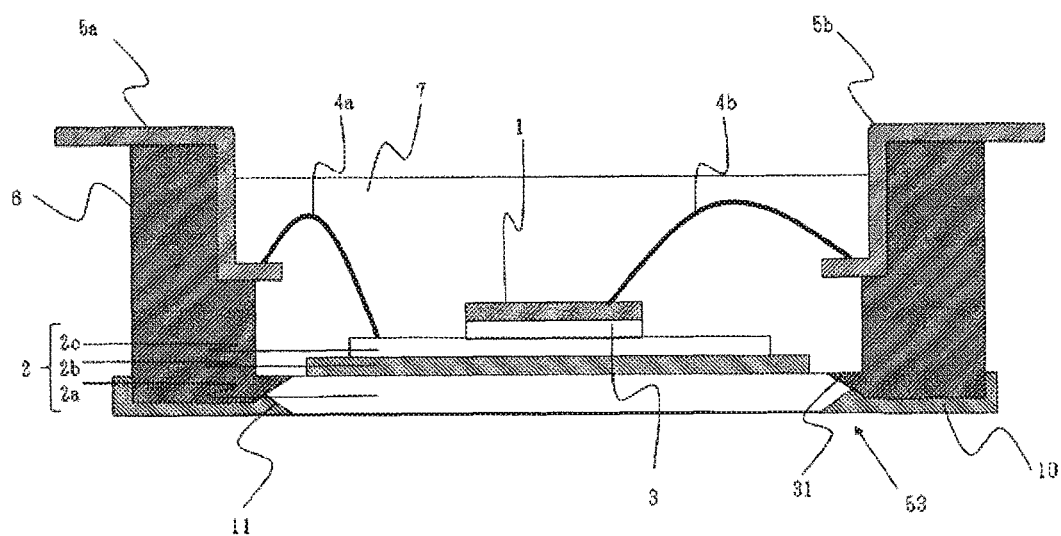
FIG. 9 is a cross-sectional view illustrating a power module which has a V-shaped cross section at an end portion of the base plate according to the second embodiment.

This embodiment is also effective for a power module 53 shown in FIG. 9, which has a V-shaped cross section 11 at an end portion of the base plate 2a. Protrusions 31 have inclined surfaces that make surface contact with the inclined surfaces of the base plate 2a in the V-shaped cross section 11. With the protrusions 31 making surface contact with the inclined surfaces of the base plate 2a, the base plate 2a and the case 6 can be easily set in position.

In the wire bonding step 62, the protrusions 30 and 31 serve as guides, so that the substrate 2 and the case 6 can be prevented from displacing from each other even when pressure is applied to the substrate 2 during the wire bonding.

Third Embodiment

Figure 10:
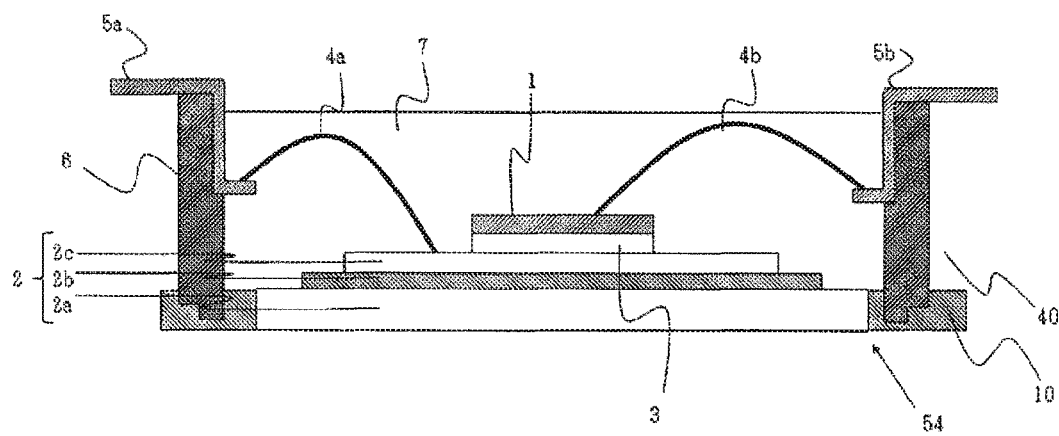
FIG. 10 is a cross-sectional view illustrating a power module according to the third embodiment.

A power module according to a third embodiment will be described. FIG. 10 is a cross-sectional view illustrating the power module 54 according to the third embodiment. In the power module 54 of the third embodiment, a step 40 is formed at the lower part of the case 6.

According to the power module according to the third embodiment, the area of contact surface between the case 6 and the bonding agent 10 is increased because of the step 40 formed at the lower part of the case 6, so that the adhesion is improved and the substrate 2 and the case 6 can be temporarily fixed without any misalignment. There may be a plurality of steps 40. The more there are steps 40, the larger the contact surface between the case 6 and the bonding agent 10, so that the adhesion will be improved even more.

Fourth Embodiment

In this embodiment, the power modules according to the first to third embodiments described above are applied to an electric power conversion device. Although the present invention is not limited to a specific electric power conversion device, a case where the present invention is applied to a three-phase inverter will be described below as the fourth embodiment.

Figure 11:
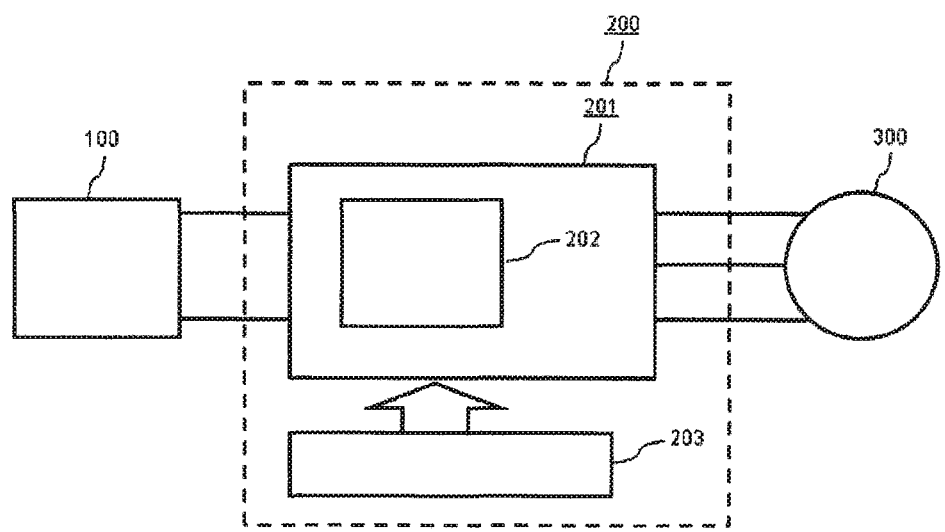
FIG. 11 is a block diagram illustrating a configuration of an electric power conversion system to which the electric power conversion device according to the fourth embodiment is applied.

FIG. 11 is a block diagram illustrating a configuration of an electric power conversion system to which the electric power conversion device according to the fourth embodiment is applied. This electric power conversion system includes a power supply 100, an electric power conversion device 200, and a load 300. The power supply 100 is a DC power supply and supplies DC power to the electric power conversion device 200. The power supply 100 can be composed of various components. For example, the power supply 100 can be composed of a DC system, a solar cell, or a storage battery, or may be composed of a rectifier or an AC/DC converter, which is connected to an AC system. Alternatively, the power supply 100 may be composed of a DC/DC converter that convers DC power output from a DC system to predetermined power.

The electric power conversion device 200 is a three-phase inverter connected to a node between the power supply 100 and the load 300, converts DC power supplied from the power supply 100 into AC power, and supplies the AC power to the load 300. The electric power conversion device 200 includes a main conversion circuit 201 that converts DC power into AC power and outputs the AC power, and a control circuit 203 that outputs a control signal for controlling the main conversion circuit 201 to the main conversion circuit 201.

The load 300 is a three-phase electric motor that is driven by AC power supplied from the electric power conversion device 200. The load 300 is not limited to a specific application. The load is used as an electric motor mounted on various electric devices, such as an electric motor for, for example, a hybrid vehicle, an electric vehicle, a railroad vehicle, an elevator, or an air-conditioner.

The electric power conversion device 200 will be described in detail below. The main conversion circuit 201 includes a switching device and a reflux diode (not illustrated). When the switching device is switched, the main conversion circuit 201 converts DC power supplied from the power supply 100 into AC power, and supplies the AC power to the load 300. The main conversion circuit 201 may have various types of specific circuit configurations. The main conversion circuit 201 according to this embodiment is a two-level three-phase full-bridge circuit, which can be composed of six switching devices and six reflux diodes connected in antiparallel with the respective switching devices. At least one of switching devices and reflux diodes of the main conversion circuit 201 are composed of a power module corresponding to any one of the first to third embodiments described above. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the main conversion circuit 201, are connected to the load 300.

Further, the main conversion circuit 201 includes a drive circuit (not illustrated) that drives each switching device. The drive circuit may be incorporated in the power module 202. Another drive circuit different from the power module 202 may be provided. The drive circuit generates a drive signal for driving each switching device of the main conversion circuit 201, and supplies the generated drive signal to a control electrode of each switching device of the main conversion circuit 201. Specifically, the drive circuit outputs, to the control electrode of each switching device, a drive signal for turning on each switching device and a drive signal for turning off each switching device, according to the control signal output from the control circuit 203, which is described later. When the ON-state of each switching device is maintained, the drive signal is a voltage signal (ON signal) having a voltage equal to or higher than a threshold voltage of the switching device. When the OFF-state of each switching device is maintained, the drive signal is a voltage signal (OFF signal) having a voltage equal to or lower than the threshold voltage of the switching device.

The control circuit 203 controls each switching device of the main conversion circuit 201 so as to supply a desired power to the load 300. Specifically, the control circuit 203 calculates a period (ON period), in which each switching device of the main conversion circuit 201 is in the ON state, based on the power to be supplied to the load 300. For example, the main conversion circuit 201 can be controlled by a PWM control for modulating the ON period of each switching device depending on the voltage to be output. Further, the control circuit 203 outputs a control command (control signal) to the drive circuit included in the main conversion circuit 201 so that the ON signal is output to each switching device to be turned on and an OFF signal is output to each switching device to be turned off at each point. The drive circuit outputs the ON signal or OFF signal, as the drive signal, to the control electrode of each switching device according to the control signal.

Power modules according to the first to third embodiments may be applied as a switching device and a reflux diode of a main conversion circuit 201 of a power conversion device. Since the base plate 2a and the case 6 are connected to each other with the bonding agent 10 on a side face of the base plate 2a, the effective area of the circuit patter 2c is secured, while electrical insulation is ensured.

Another effect achieved by the base plate 2a and the case 6 connected to each other with the bonding agent 10 on a side face of the base plate 2a is that deterioration of the insulating layer 2b caused by moisture absorption can be minimized, since the case 6 and the base plate 2a are completely joined together.

While this embodiment illustrates an example in which the present invention is applied to a two-level three-phase inverter, the present invention is not limited to this and can be applied to various electric power conversion devices. While this embodiment illustrates a two-level electric power conversion device, the present invention can also be applied to a three-level or multi-level electric power conversion device. When power is supplied to a single-phase load, the present invention may be applied to a single-phase inverter. The present invention can also be applied to a DC/DC converter or an AC/DC converter when power is supplied to a DC load or the like.

Further, in the electric power conversion device to which the present invention is applied, the above-mentioned load is not limited to an electric motor. For example, the load may also be used as a power supply device for an electric discharge machine, a laser beam machine, an induction heating cooker, or a non-contact device power feeding system. More alternatively, the load may be used as a power conditioner for a photovoltaic power generating system, an electricity storage system, or the like.

Various embodiments and variation examples of the present invention can be freely combined to modify or omit given features in each of the embodiments as required within the scope of the invention.

The conductive component that joins parts together should preferably be a metal having low electrical resistance such as solder, metal paste containing a metal filler, or sintered metal that is metalized by heating.

The semiconductor device 1 can be any type of switching device or diode, such as, for example, insulated gate bipolar transistor (IGBT), metal oxide semiconductor field effect transistor (MOSFET), Schottky barrier diode (SBD), PN diode, and the like. The number of the semiconductor device is not limited to one but can be two or more.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2018-067818, filed on Mar. 30, 2018 including specification, claims, drawings and summary, on which the Convention priority of the present application is based, is incorporated herein by reference in its entirety.

The invention claimed is:
1. A semiconductor apparatus comprising:
a substrate including an insulator disposed between a circuit pattern on an upper surface side and a metal plate on a lower surface side;
a semiconductor device joined to the circuit pattern via a conductive component;
a case located to surround the substrate, a gap being between the case and a lateral side face of the substrate;
a sealing material sealing the semiconductor device and the substrate in a section surrounded by the case; and
a bonding agent bonding the case and the metal plate on the lateral side face of the substrate, the bonding agent extending along a bottom surface of the case and filling the gap between the case and the lateral side face of the substrate.

2. The semiconductor apparatus according to claim 1, wherein a lower part of the case includes a protrusion that makes contact with an upper surface of the metal plate.

3. The semiconductor apparatus according to claim 1, wherein a lower part of the case includes a step.

4. The semiconductor apparatus according to claim 2, wherein a lower part of the case includes a step.

5. The semiconductor apparatus according to claim 1, wherein the bonding agent covers a lower part of the case that is higher than the bottom surface of the case.

6. The semiconductor apparatus according to claim 2, wherein the bonding agent covers the protrusion.

7. The semiconductor apparatus according to claim 3, wherein the bonding agent covers the step.

8. The semiconductor apparatus according to claim 4, wherein the bonding agent covers one or both of the protrusion and the step.

9. An electric power conversion device comprising:
a main conversion circuit including the semiconductor apparatus according to claim 1, converting input power and outputting converted power; and
a control circuit outputting a control signal for controlling the main conversion circuit to the main conversion circuit.

10. The semiconductor apparatus of claim 1, wherein the bonding agent includes a thermoplastic resin.

11. A semiconductor apparatus comprising:
a substrate including an insulator disposed between a circuit pattern on an upper surface side and a metal plate on a lower surface side;
a semiconductor device joined to the circuit pattern via a conductive component;
a case located to surround the substrate;
a sealing material sealing the semiconductor device and the substrate in a section surrounded by the case; and
a bonding agent bonding the case and the metal plate on a lateral side face of the substrate, the bonding agent covering a bottom surface of the case.

12. The semiconductor apparatus according to claim 11, wherein a bottom surface of the bonding agent is coplanar with a bottom surface of the metal plate.

13. A semiconductor apparatus comprising:
a substrate including an insulator disposed between a circuit pattern on an upper surface side and a metal plate on a lower surface side;
a semiconductor device joined to the circuit pattern via a conductive component;
a case located to surround the substrate;
a sealing material sealing the semiconductor device and the substrate in a section surrounded by the case; and
a bonding agent covering a lower inner part, a lower outer part, and a lower surface of the case, bonding the lower inner part of the case and a lateral side face of the metal plate on a lateral side face of the substrate.

* * * * *